US007382082B2

(12) United States Patent
Bhardwaj

(10) Patent No.: US 7,382,082 B2
(45) Date of Patent: Jun. 3, 2008

(54) PIEZOELECTRIC TRANSDUCER WITH GAS MATRIX

(76) Inventor: Mahesh C. Bhardwaj, 238 E. Doris Ave., State College, PA (US) 16801

(*) Notice: Subject to any disclaimer, the term of this patent is extended or adjusted under 35 U.S.C. 154(b) by 1289 days.

(21) Appl. No.: 10/337,531

(22) Filed: Jan. 7, 2003

(65) Prior Publication Data

US 2004/0032188 A1 Feb. 19, 2004

Related U.S. Application Data

(60) Provisional application No. 60/403,494, filed on Aug. 14, 2002.

(51) Int. Cl.
*H01L 41/08* (2006.01)

(52) U.S. Cl. ...................... 310/357; 310/334; 310/335; 310/337; 310/800

(58) Field of Classification Search ........ 310/357–359, 310/334, 366
See application file for complete search history.

(56) References Cited

U.S. PATENT DOCUMENTS 4,330,593 A 5/1982 Shrout et al.
4,412,148 A 10/1983 Klicker et al.
4,658,176 A 4/1987 Nakaya et al.
4,728,845 A * 3/1988 Haun et al. ................. 310/358
5,065,068 A * 11/1991 Oakley ........................ 310/357
5,142,187 A * 8/1992 Saito et al. ................. 310/358
5,325,011 A * 6/1994 Kahn et al. ................. 310/358
5,571,369 A 11/1996 Dixon et al.
6,311,573 B1 11/2001 Bhardwaj

* cited by examiner

*Primary Examiner*—Mark Budd
(74) *Attorney, Agent, or Firm*—The Webb Law Firm

(57) ABSTRACT

A piezoelectric transducer defined by two faces comprises a plurality of piezoelectric cylinders. The axial length and composition of the piezoelectric cylinders determines the frequency of the transducer when excited. The axial ends of the piezoelectric cylinders are aligned with the faces. The piezoelectric cylinders are separated from each other and the space therebetween is fully or partially empty such that crosstalk between piezoelectric cylinders is substantially eliminated. Electrodes are produced at the faces of the transducer for simultaneously exciting the piezoelectric cylinders.

11 Claims, 10 Drawing Sheets

PIEZOELECTRIC TRANSDUCER WITH GAS MATRIX

CROSS REFERENCE TO RELATED APPLICATIONS

This application claims subject matter disclosed in Provisional Patent Application Ser. No. 60/403,494, filed Aug. 14, 2002.

BACKGROUND OF THE INVENTION

1. Field of the Invention

This invention is in the field of piezoelectric transducers for ultrasound devices, more particularly, piezoelectric transducers comprising piezoelectric cylinders isolated from a support matrix by a gas or vacuum and arranged such that they are separated from each other by less than one wavelength in that matrix.

2. Description of Related Art

Transducers are devices that transform input signals into output signals of a different form. In ultrasound devices, they transform signals of electrical energy into acoustic energy or produce electrical signals from absorbed sound waves. Piezoelectric ceramic materials are particularly effective for this type of electromechanical energy conversion and have found wide use in the transducer field. Many piezoelectric ceramics have very high electromechanical coupling coefficients, $k_T$ (approximately 0.5), which indicate how effective a material is at transferring electrical energy into mechanical energy.

In the fields of non-destructive testing of materials, biomedical non-invasive diagnostics, and ultrasonic power generation, it is highly desired that the source (transmitter) of ultrasound, that is, the transducer device, be characterized by high transduction in the medium of transmission. It is further desired that the receiver of ultrasound be very sensitive to detect even the minutest ultrasonic vibrations, irrespective of the medium or the mechanism by which they are generated.

A second important property for effective ultrasound transducers is the acoustic impedance of the transducer material. Acoustic impedance describes the compressibility of a material and is found by taking the product of the density of a material and the velocity of sound in that material. When a sound wave propagating in material X encounters an interface between X and a second material Y, the size of the difference between the acoustic impedances of X and Y determines the amount of sound energy that is transmitted across the interface and the amount of sound energy that is reflected back into the first material. The greater the difference, the less sound energy that is received into the second material. The transmission of sound energy between two materials is termed acoustic coupling, higher coupling means higher transmission of sound energy. The size of the difference between the values of acoustic impedance is what determines the degree of acoustic coupling in that system. Systems with low differences in acoustic impedance exhibit the best coupling. Piezoelectric ceramics, such as $Pb(Zr, Ti)O_3$ (PZT), have very high acoustic impedances (Z), on the order of $10^7$ Rayl (kg/m$^2$.*s), as compared with air, where Z=410 Rayl. In ultrasound applications, the large difference in acoustic impedance between the probe material (e.g., water) and the monolithic piece of ceramic results in a large proportion of reflected sound waves at the transducer surface. Therefore, the information contained in those sound waves about the probed material is lost because it is not received by the transducer efficiently.

One solution to this problem of poor acoustic coupling is to, create matching layers between the monolithic piece of ceramic and the sample and to use a backing medium behind the ceramic. These layers attenuate sound energy and still lose energy to reflection and are not a perfect solution to the problem. A second solution is to combine the strong piezoelectric characteristics of a ceramic with the better acoustic coupling properties of another material in a composite. Most early attempts to create composites involved loading ceramic particles into a polymer matrix to create a homogenous composite. These composites had low acoustic impedances, but the polymer shielded the piezoelectric ceramic particles from applied electric fields, preventing poling of the ceramic particles. In addition, the polymer acted to dampen waves generated by the ceramic.

Efforts to solve these problems resulted in the development of composites consisting of a porous three-dimensional piezoelectric ceramic network, which could be impregnated with a polymer to lower the acoustic impedance of the overall structure. Shrout et al. U.S. Pat. No. 4,330,593 discloses a method for forming a so-called 3-3 structure (3-3 indicates the ceramic is interconnected in all three directions, and the polymer is also interconnected in all three directions). Since their development, it has been realized that the nature of the phase interconnection controls the dielectric flux pattern and mechanical stress distribution in the composite material.

One theoretically promising arrangement of phases taught by Klicker et al. in U.S. Pat. No. 4,412,148 was a polymer matrix connected in three dimensions, impregnated with piezoelectric ceramic rods oriented in the same direction. This design was termed 1-3 connectivity. The theoretical concept was that the polymer matrix was much softer and had better acoustic coupling with water or tissue and would deform when impacted by a sound wave. The polymer would bind to the side surfaces of the piezoelectric ceramic rods and would transfer the strain energy into the ceramic. In this configuration, the many small rods would have a much greater surface area under strain than a monolithic ceramic. It was hoped this would result in more mechanical energy being transferred. While this configuration did not realize its theoretical potential, partially because most polymers used had very high Poisson ratios which generated internal stresses that opposed the applied stress of the sound waves, it was still a tremendous improvement over previous designs in terms of piezoelectric voltages and sensitivity. The lower dielectric permitivity of the polymer allowed for more complete poling of the piezoelectric material. More complete poling, coupled with a lower overall dielectric constant, allowed for higher piezoelectric voltages than in the monolithic ceramic.

While these composites offer improved acoustic coupling and mechanical response, they still have problems. Depending on the arrangement of rods in the matrix, there is the potential for a so-called grating lobe, a form of acoustic noise, to develop during transmission of ultrasonic waves. Grating lobes consist of undesirable ultrasonic waves being emitted in the directions determined by the pitch of the piezoelectric cylinder arrangement, which acts to deteriorate the ultrasound image. Nakaya et al. U.S. Pat. No. 4,658,176 offered a solution to this problem by spacing apart the cylinders at less than one wavelength of the fundamental frequency of the transducer. This arrangement was found to ameliorate the problem of grating lobe formation and improve ultrasound images obtainable with 1-3 composites.

Despite these improvements, performance problems still remain for piezoelectric transducers. The modern piezoelectric composites offer excellent acoustic matching for human tissue and the flexibility needed for medical probes, but they still have acoustic impedances which remain much greater than what is needed for non-contact applications where transmission through air is necessary. Non-contact ultrasound, which is particularly important for materials characterization, requires good acoustic coupling between air and the transducer to achieve high resolution and polymers with acoustic impedance values in excess of $10^6$ Rayl.

An additional challenge in all piezoelectric ceramics is an effect known as planar coupling. In most transducers, the composite is placed between electrodes and polarized in the direction perpendicular to the electrodes, or the 3 direction. The object is to apply an electric field to the composite and cause displacement in the 3 direction, generating ultrasound waves. In most piezoelectric ceramics, such as PZT, when a field is applied in the 3 direction, there is simultaneous mechanical action in the 1 and 2 directions that are perpendicular to the 3 direction. This is known as planar coupling. While reducing the size of the piezoelectric element helps reduce the magnitude of the planar coupling, the problem remains. In 1-3 composites, planar coupling in the piezoelectric cylinders generates vibrations that propagate through the polymer to other elements in the transducer creating noise, which is termed crosstalk in the art. This noise reduces the resolution of the device. This type of noise is especially troublesome in devices where one part of the array of cylinders is used to transmit ultrasound waves and another part is used to receive the reflected waves. In these arrangements, the waves resulting from planar coupling in the transmitting cylinders are propagated through the polymer to the receiving cylinders creating noise and reduce the image quality. Therefore, the object of the present invention is to overcome deficiencies in the prior art.

The current ultrasonic transducer devices utilize a piezoelectric material, the front and back faces of which are bonded with a variety of materials that modify the resonance and frequency characteristics of the piezoelectric material with respect to ultrasound transmission in a given medium. In such devices, the piezoelectric materials used are: Lead Zirconate-Lead Titanate solid solutions, Lead meta Niobates, Lead Titanates, Lead Magnesium Niobate, Lithium Niobate, Zinc Oxide, Quartz, Barium Titanate, polymer-based homogeneous materials, polymer matrix solid piezoelectric materials, etc. Materials used on the back, front, and on the sides of the piezoelectric materials are: rigid, porous, monolithic or composite, particulate, or fibrous metals, alloys, ceramics, polymers, etc. Depending upon the type of piezoelectric material and those that surround it, the devices according to the current art can be made to generate high transduction in the medium of ultrasound transmission. See Bhardwaj U.S. Pat. No. 6,311,573.

If the devices according to the current art are to be used for certain applications, such as for power generation or for high transduction in attenuative media (gases, coarse grained, open or closed cell materials) particularly in high frequency range, say from 100 kHz to greater than 1 MHz, then one has to apply relatively high electrical power to the devices. Whereas some applications can be successfully executed by doing so, yet there are others that cannot. The reason for this being high power excitation of transducers results in the heating of the piezoelectric material, subsequently destroying the entire device. Besides this, too high electrical power can be dangerous and more cumbersome to handle in a practical manner. Therefore, it is necessary to develop a piezoelectric device that is inherently characterized by transduction efficiency higher than those that are produced according to the current art. The present invention has been shown to overcome the limitations of the prior art.

SUMMARY OF THE INVENTION

Briefly, according to this invention, there is provided a piezoelectric transducer defined by two faces. The transducer comprises a plurality of piezoelectric cylinders. The axial length and composition of the piezoelectric cylinders determine the frequency of the transducers when excited. The axial ends of the piezoelectric cylinders are aligned with the faces. The piezoelectric cylinders are separated from each other in a manner to substantially reduce or substantially eliminate crosstalk. The piezoelectric cylinders or fibers may be separated from each other by a space that is empty or a space that is partially empty of matrix material resulting in a gap between the cylinders and the material so that cylinders and material are substantially entirely unconnected. The piezoelectric cylinders are separated from each other by a distance that is preferably less than the acoustic wavelength at the frequency of the piezoelectric cylinders or fibers in the space between the cylinders. Electrodes are provided at the faces of the transducer for simultaneously exciting the piezoelectric cylinders.

According to another embodiment of this invention, a piezoelectric transducer is defined by two substantially parallel faces and a support structure provides mechanical strength to the transducer between the faces. Piezoelectric cylinders are arranged between the parallel faces with cylindrical axes substantially perpendicular to the parallel faces. The axial length and composition of the piezoelectric cylinders determine the frequency of the transducers when excited. The piezoelectric cylinders are separated from each other by a space and there is a gap in the space free of solid or liquid material. The piezoelectric cylinders are separated from each other by a distance that is preferably less than the acoustic wavelength at the frequency of the piezoelectric cylinders in the space therebetween. Electrodes are provided at the parallel faces of the transducer for simultaneously exciting the cylinders.

The piezoelectric cylinders may have one or more of the following cross sections: circular, rectangular, hexagonal, or any other polygon, with a width preferably less than one wavelength of the frequency in the piezoelectric material.

The material may comprise a solidified foam, fiber batting or honeycomb, for example, which material is not electrically conductive.

The gap in the space between the piezoelectric cylinders may be filled with a gas at atmospheric pressure, gas below atmospheric pressure, or a vacuum.

Other objects and features of the invention will appear in the course of the description thereof, which follows.

DESCRIPTION OF THE PREFERRED EMBODIMENTS

The transducer of the present invention uses piezoelectric cylinders with a preferred diameter of less than one wavelength of the frequency in the piezoelectric ceramic. These cylinders are preferably set apart by a distance less than one wavelength of the frequency in the support matrix. The support matrix may consist of foams, ceramics, polymers, fiber batting, or other materials that allow for voids into which the piezoelectric cylinders may be inserted. The piezoelectric cylinders are separated, except for incidental brushing contact, from the matrix material by a layer of gas or a vacuum, isolating the piezoelectric elements from the support matrix.

This invention improves on the prior art performance of these arrays of piezoelectric cylinders, which are normally embedded and bonded to some type of polymer matrix, by isolating them in a support matrix which provides mechanical strength of the overall transducer assembly and protects the array of piezoelectric cylinders. In previous designs, the deformation of the matrix along with the piezoelectric elements was the essential feature of the composite's operation. The current design instead focuses on mechanically isolating the piezoelectric elements to prevent electromechanical crosstalk between adjacent cylinders. This isolation also serves to reduce the effects of planar coupling on resolution and sensitivity. The composite still benefits from the lowered overall dielectric constant, which allows high voltages to be obtained when ultrasound waves are received as compared to a monolithic piezoelectric ceramic. The design also lowers the overall transducer acoustic impedance allowing for better coupling between the transducer and air or other low impedance materials.

Figure 1A:
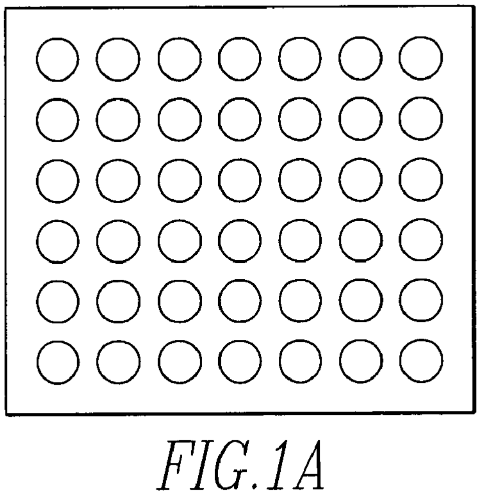
FIG. 1A is a schematic drawing of the perforated foam material.
Figure 1B:
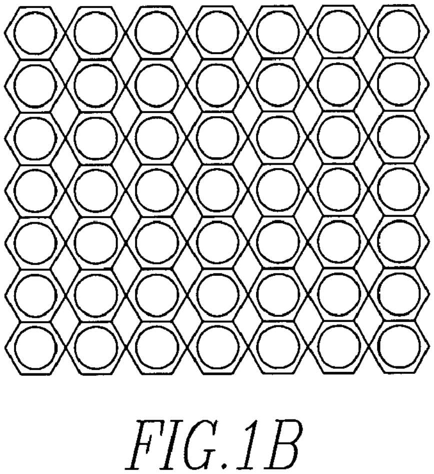
FIG. 1B is a schematic drawing of a honeycomb core suitable as a support matrix.
Figure 2A:
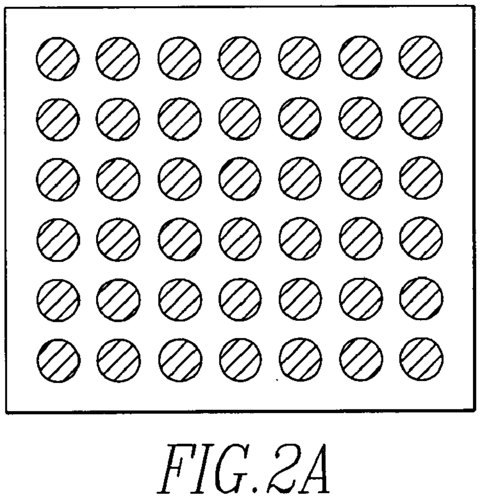
FIGS. 2A and 2B are schematic drawings of a perforated foam material and a honeycomb core, respectively, supporting piezoelectric ceramic cylinders.
Figure 2B:
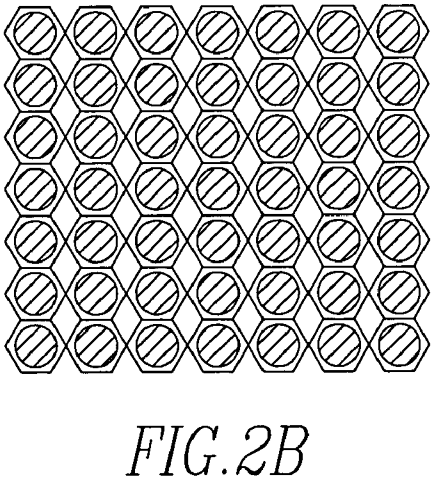

The transducer of the current design may be constructed by taking a support matrix, such as a foam with holes drilled in it (as shown in FIG. 1A) or a honeycomb structure (FIG. 1B), and inserting a piezoelectric ceramic (e.g., $LiNbO_3$, $Pb(Zr, Ti)O_3$, Pb,Mg(NbO3), $Pb(Zr, Ln, Ti)O_3$) cylinders into the holes (as shown in FIG. 2A) or cells of a honeycomb structure (FIG. 2B). The width of the cylinder preferably should be less than one wavelength of a specified frequency in the piezoelectric material. The holes or cells in the support matrix material must be spaced such that the distance between them is preferably less than one wavelength in the matrix material. The reason for the width and spacing in the transducer is to reduce or eliminate the problems with acoustic nodes.

Figure 3:
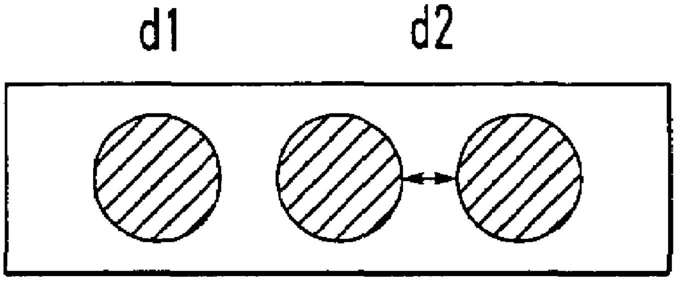
FIG. 3 is a drawing showing the relationship between the support matrix and the piezoelectric cylinders, preferably the width of the cylinder d1 and the distance between the cylinders d2 are less than one wavelength in the piezoelectric material at a specified frequency.

FIG. 3 illustrates the relationship between the matrix and the piezoelectric cylinders. The diameter d1 of the cylinders is preferably less than one wavelength of the piezoelectric material. The spacing d2 between adjacent piezoelectric cylinders is less than one wavelength of the matrix gas and structure at the frequency of the transducer.

Figure 4:
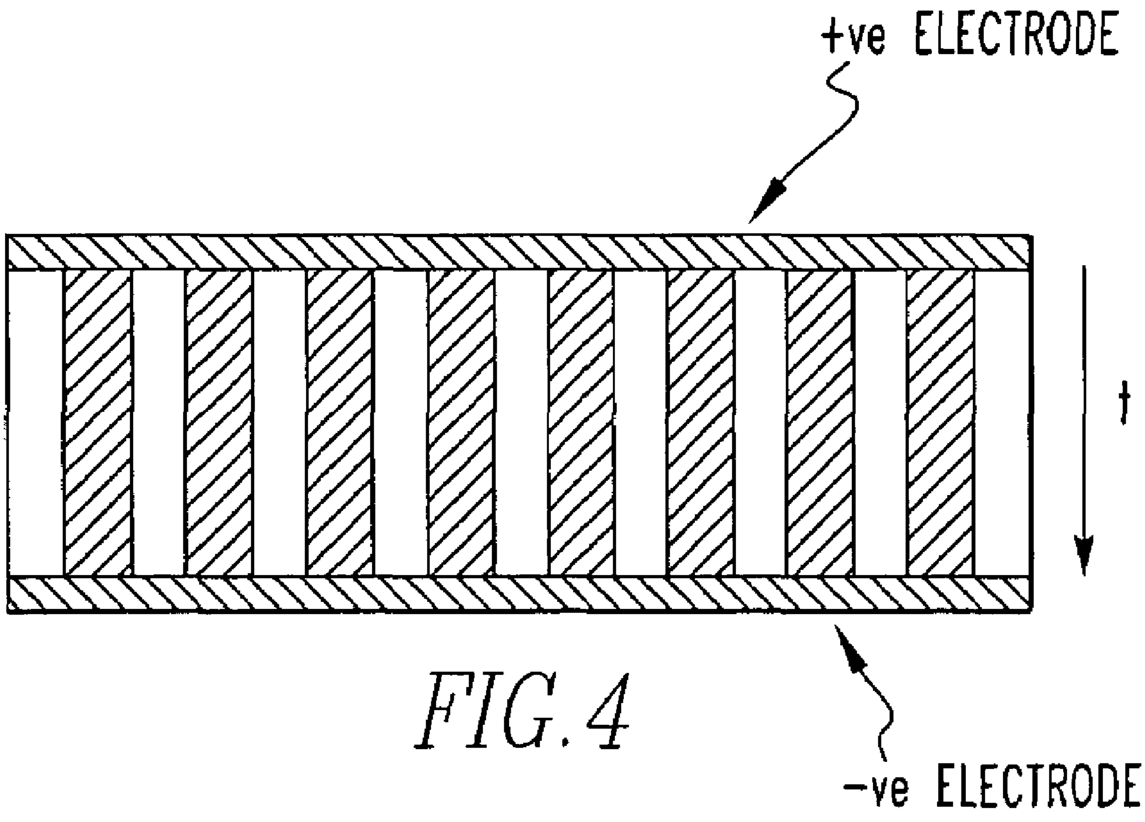
FIG. 4 is a section view of the transducer according to this invention with the surface fully electroded, the spacing between the cylinders and the width of the cylinders being less than one wavelength at a specified frequency, and t is the thickness of the transducer.
Figure 5:
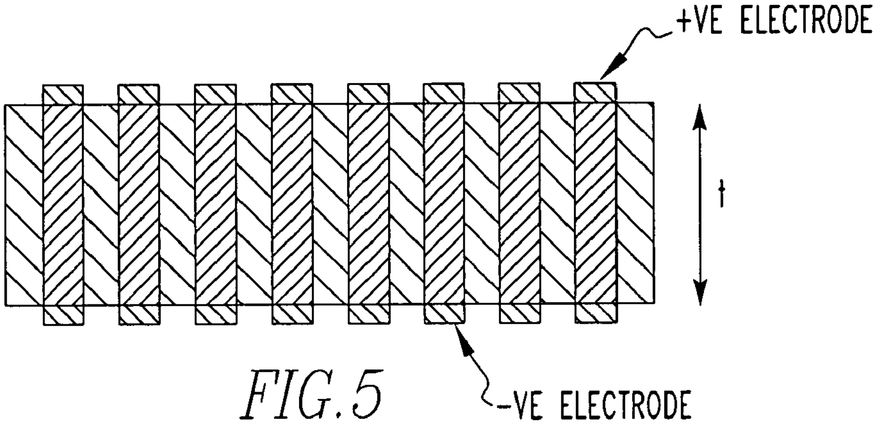
FIG. 5 is a section view of the transducer according to this invention with the alternative method of electroding individual cylinders rather than the entire surface for reduction of the penetration of conducting material into the support matrix, the spacing between the cylinders and the width of the cylinders being less than one wavelength at a specified frequency, and t is the thickness of the composite.
Figure 6A:
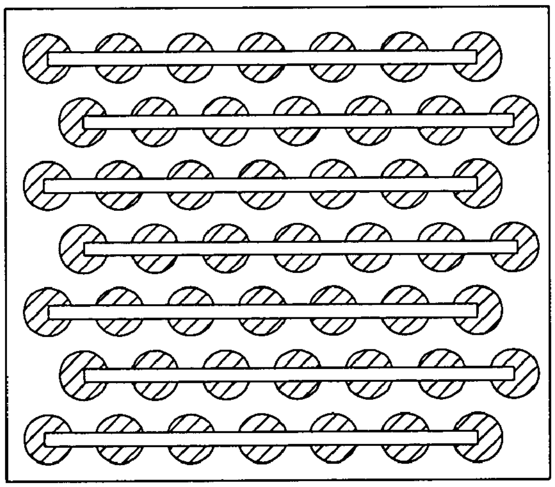
FIGS. 6A and 6B show a schematic drawing of an array with electrodes applied to rows of cylinders in two different ways.
Figure 6B:
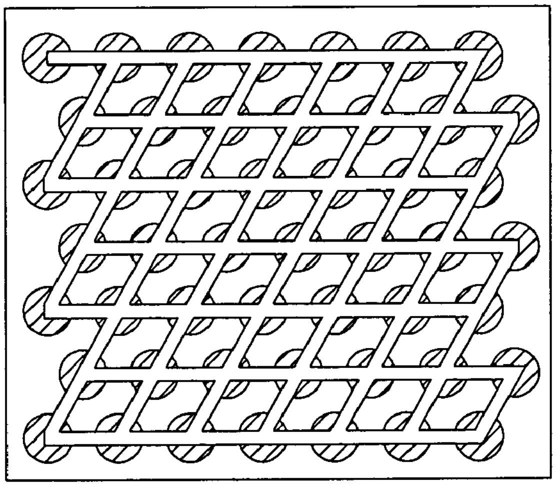

FIG. 4 illustrates a common electrode sheet for exciting all piezoelectric cylinders at one time. FIG. 5 illustrates lead wires to each individual piezoelectric cylinder. The latter arrangement, while more difficult to fabricate, will be less susceptible to crosstalk between cylinders. FIGS. 6A and 6B illustrate alternate arrangements for attaching strips of conductive material across the ends of the piezoelectric cylinders.

Metallic and non-metallic honeycomb materials are commercially available, for example, from Hexal Composites, Duxford, Cambridge CB2 4QD, United Kingdom. These honeycomb materials have thin walls comprised of various materials, such as glass fabric reinforced with phenolic resin and paper reinforced with phenolic resin. The walls divide off the cells, which may have a hexagonal cross section. One suitable honeycomb structure is formed of abutting corrugated layers wherein the peaks of one layer are attached to the grooves of the other layer. There are many ways of making honeycomb structures. See, for example, Dixon et al. U.S. Pat. No. 5,571,369.

The piezoelectric cylinders are not attached to the support matrix material, though there can be some contact between the support matrix and the cylinders. A key feature is that the gaps between the cylinders and the support matrix are filled with some gas, mixture of gases, or a vacuum. While the prior art has relied on surface contact and attachment between the cylinders and the matrix material to transfer energy between the matrix and the ceramic, the current invention makes use of this gap to isolate the cylinders minimizing mechanical crosstalk and noise between the piezoelectric elements. The gas or vacuum between the support matrix and the rods allows for improved coupling with air in non-contact applications, while still being able to take advantage of the larger piezoelectric voltages and improved sensitivity offered by the piezoelectric cylinders in a 1-3 arrangement over a monolithic ceramic.

In the prior art, the focus was on the matrix properties and finding a matrix arrangement that would optimize overall composite properties, such as dielectric constant or acoustic impedance. In the present invention, the focus is on the piezoelectric elements, their arrangement, and isolation to optimize their performance. In a transducer making use of the current invention, improved performance is realized by combining ceramic element size and shape, which effectively eliminates planar coupling coefficients and raises piezoelectric voltages in the overall transducer arrangement, with the benefits of mechanical isolation, such as reduced noise and crosstalk between elements in the transducer. The support matrix used in one embodiment of the current invention serves primarily to impart mechanical strength or flexibility to the piezoelectric array.

In some applications, better performance may be realized by taking the isolation a step further by removing the support matrix material entirely and leaving only gas or vacuum between the piezoelectric cylinders. This configuration would take advantage of the complete mechanical isolation of the piezoelectric cylinders to provide for better resolution of the reflected ultrasound waves. When no support matrix is used, the cylinders may be held in place by placing them between two horizontal metal plates and bonding the plates to the top and bottom faces of the cylinders.

The other important feature is the electroding on the surface of the composite, which provides electrical connection to the control and measuring devices. The electroding can either be on the full surface of the composite or the individual faces of the piezoelectric cylinders. When the surface is fully electroded, care must be taken to prevent the conductive material (Cu, Al, Au, Ag, Ni, Pt, etc.) from penetrating into the matrix material.

Gas matrix piezoelectric material is characterized by the following highly desired characteristics: extremely high thickness mode coupling, which is equal to that of the solid piezoelectric material; practically zero planar coupling, which is usually very high for high coupling piezoelectric materials; very low dielectric constant; very low density; and very low pyroelectric charge development.

Figure 7:
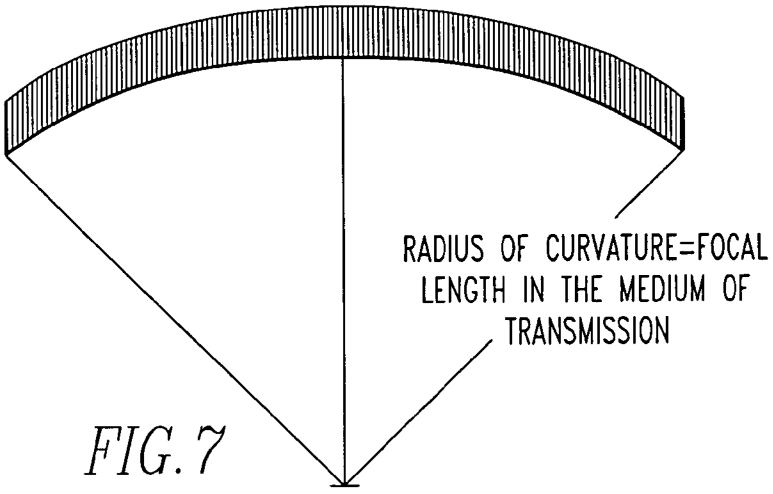
FIG. 7 is a schematic illustration of an arrangement of equal length piezoelectric cylinders arranged for focusing.

FIG. 7 shows the cross section of equal length piezoelectric cylinders arranged between two faces that are curved in order to generate a geometric focus. The type of curvature can be spherical to produce a point focus, it can be parabolic to create a cylindrical focus, or it can be a combination of the two to create a compound focus.

Figure 8:
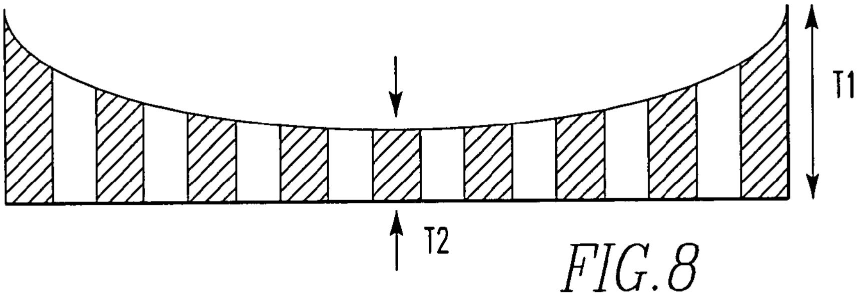
FIG. 8 is a schematic illustration of an arrangement of piezoelectric cylinders of variable lengths to produce a broadband transducer.

FIG. 8 shows the cross section of variable length piezoelectric cylinders arranged between a plane face and a curved face. By doing so, the axial length of the solid piezoelectric cylinders and correspondingly that of the matrix will be different at different places, the magnitude of which is defined by the radius of curvature of the curved face. In this embodiment, it is preferred that the thickness T2 of the central portion of the material be one half of that of the outermost thickness T1. By do so, it is possible to make a very broadband gas matrix piezoelectric material, because it is characterized by multiple frequencies within the thickness T1 and T2 of the solid piezoelectric material.

Figure 9:
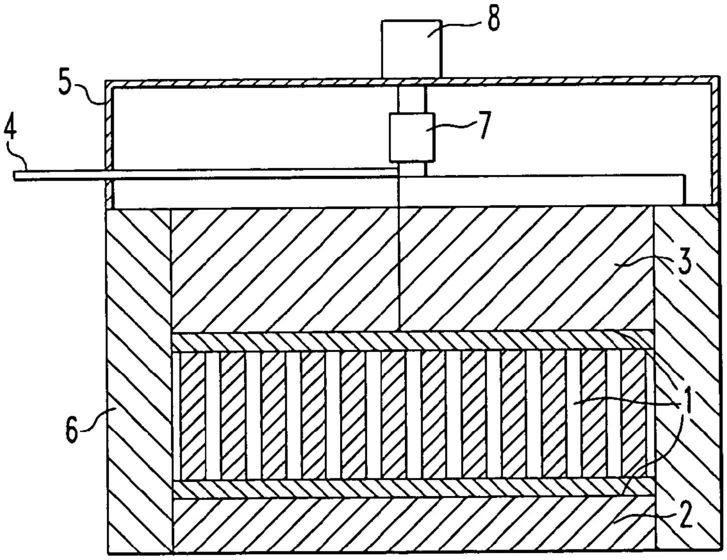
FIG. 9 is a schematic cross-sectional view through a transducer assembly according to this invention.

FIG. 9 shows the details of a transducer device based upon gas matrix piezoelectric materials. The gas matrix piezoelectric material 1 has a frequency which is determined by the formula: F=FC/t, where FC is the frequency constant (mm*MHz) and t is the thickness of the gas matrix composite in millimeters. The composition of acoustic impedance or Z matching single or multiple layers 2 abutting the piezoelectric materials have a composition that determines the efficiency of ultrasound transmission in the medium in which propagation of ultrasound is desired. The total thickness of this layer, individually or collectively (if multiple), preferably should be one-quarter of the wavelength in the Z matching layer. The thickness d of the Z matching layer in mm is determined by the formula: $d=\lambda/F$, where $\lambda$ is the wavelength in the acoustic impedance matching layer in millimeters, and $\lambda=V/F$, where V is the velocity of ultrasound in the Z matching layer. The Z matching layer materials may comprise single or multiple layers of homogeneous or particulate or fibrous metals, ceramics, polymers, or their combinations.

Depending upon the physical characteristics of the damping material 3, this material modifies the pulse shape and the frequency characteristics of the ultrasound device. The thickness of this material is less than one-eighth of the wavelength or more, preferably, one quarter of the wavelength. The damping materials may comprise single or multiple layers of homogeneous or particulate or fibrous metals, ceramics, polymers, or their combinations. Electrically conductive wires 4 are bonded to the faces of the piezoelectric material and to a suitable coaxial cable or connector 8. The transducer housing 5 may comprise metal, ceramic, polymer, or a composite. The sides 6 of the transducer may be encapsulated with a material, such as non-electrically conductive epoxy, rubber, or inorganic cement. If desired, an electrically tuning network 7 may be installed between the −ve and +ve faces of the piezoelectric composite.

Figure 10:
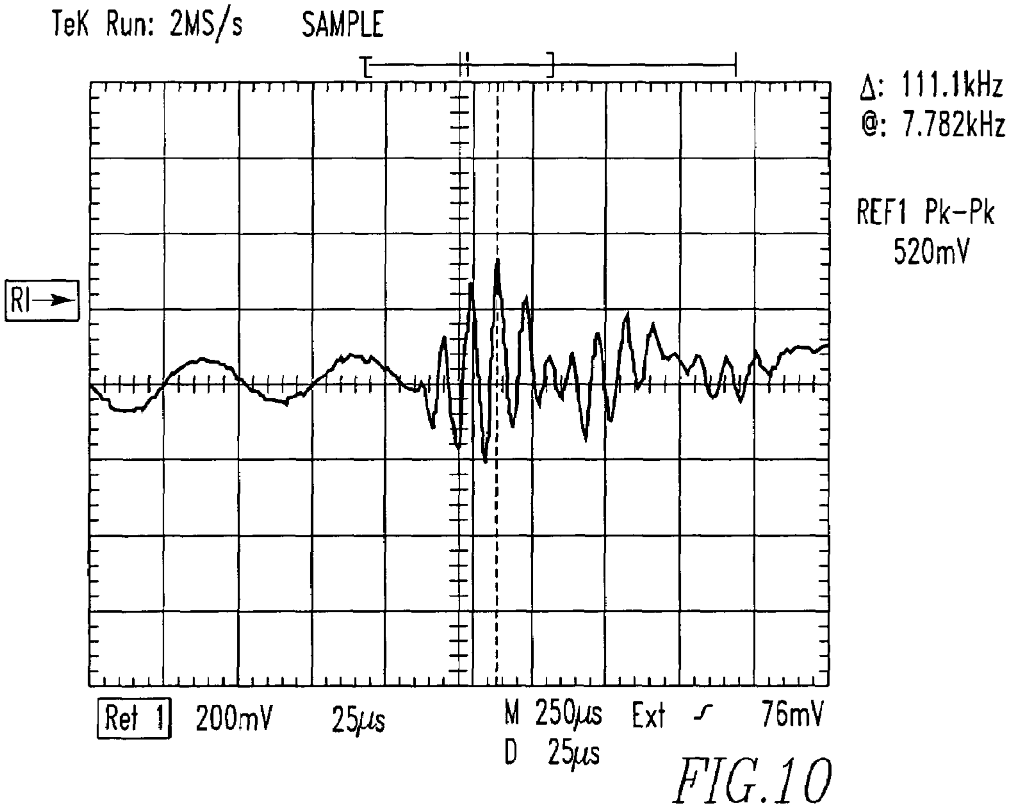
FIG. 10 is an oscilloscope trace showing a signal reflected through air from a surface to a comparative polymer matrix transducer.
Figure 11:
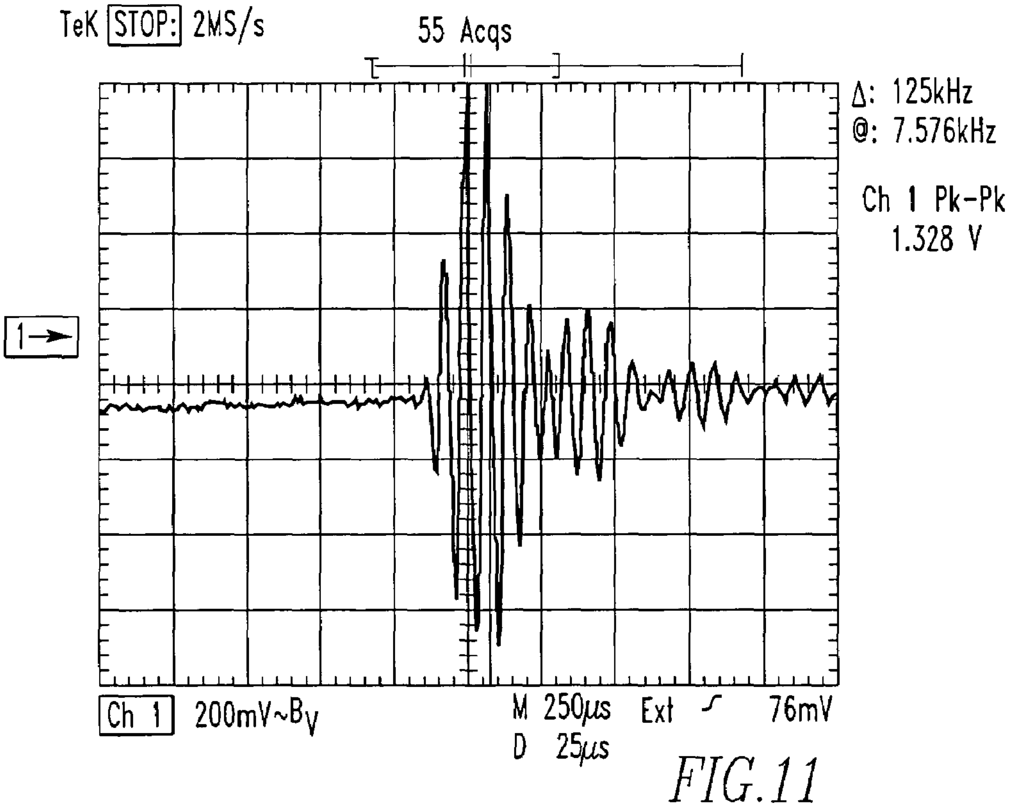
FIG. 11 is an oscilloscope trace showing a signal reflected through air from a surface to a gas matrix transducer made according to this invention.

A comparison between the polymer matrix and gas matrix piezoelectric transducers is informative. The testing was conducted at a frequency of about 125 kHz. The active area of the transducers was 50×50 mm. The transducers were excited with a 220 volt negative spike pulse. A steel plate was placed 180 mm away from the transducer in ambient air. The gain of the receiver was 20 dB. FIG. 10 is an oscilloscope display recording the reflected pulse for a polymer matrix transducer. The amplitude of the reflected pulse is 0.52 volts. FIG. 11 is an oscilloscope trace recording the reflected pulse for a gas matrix transducer according to this invention. The amplitude of the reflected pulse is 1.33 volts. Upon comparison of the polymer and gas matrix piezoelectric materials, it is apparent that the reflected signal of the latter is more than 60% or more than 8 dB greater than that of the former. Similar improvement is observed when the devices made for operation in water and in contact with solid materials are tested.

Figure 12:
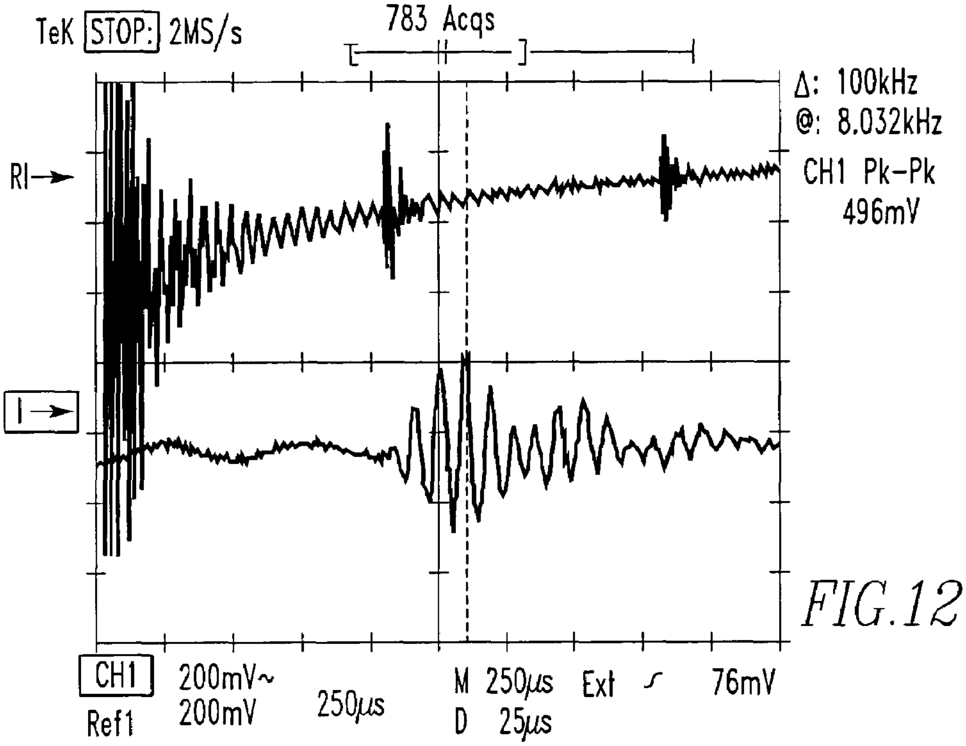
FIG. 12 is an oscilloscope display showing a reflected signal through air from a surface to a polymer matrix transducer with the top trace being the entire signal and the bottom trace the amplified reflected signal.
Figure 13:
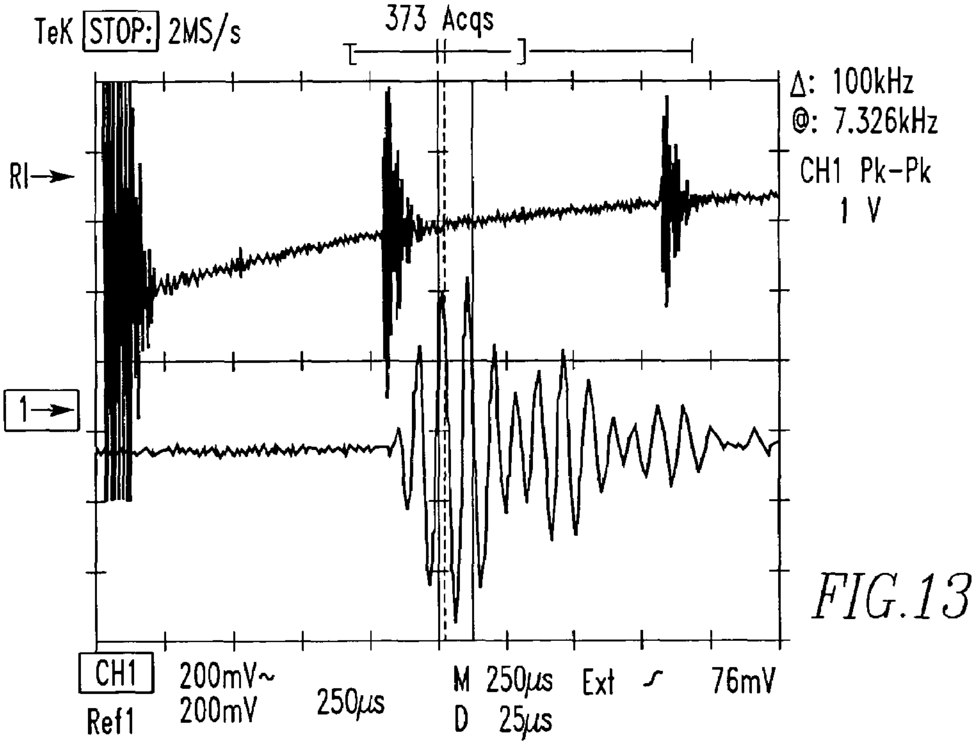
FIG. 13 is an oscilloscope display showing a reflected signal through air from a surface to a gas matrix transducer according to this invention with the top trace being the entire signal and the bottom trace the amplified reflected signal.

A further comparison of polymer matrix piezoelectric and gas matrix piezoelectric transducers in ambient air was made as follows: Frequency: 100 kHz. Active area: 50×50 mm. Excitation: 220 V negative spike. Relative gain: 20 dB. Reference signal: Reflection from a flat steel plate about 180 mm away from the transducer in ambient air. FIGS. 12 and 13 are oscilloscope displays showing the excitation pulse and reflected signals for the polymer matrix and gas matrix transducers, respectively. The top trace is the complete signal and in the bottom trace the horizontal scale has been changed to show the details of the signal reflected from the steel plate at 180 mm away from the transducer in ambient air.

FIG. 12 shows that the polymer matrix piezoelectric transducer had a low signal-to-noise ratio and a definitely noisy time base. The reflected signal amplitude was 0.5 volts. FIG. 13 shows that the gas matrix piezoelectric transducer has a very high signal-to-noise ratio and a very clean time base. The reflected signal amplitude was 1 volt which is 6 dB (50%) higher than the polymer matrix piezoelectric transducer. It should be noted that the conditions of transducer excitation and signal amplification in FIGS. 12 and 13 are the same. By comparison, the gas matrix piezoelectric transducer according to this invention is excellent. The improved signal-to-noise ratio is due to the substantial elimination of the radial component of the piezoelectric materials. A further benefit of the substantial elimination of the radial components is that adjacent transducers do not transfer radial components.

Figure 14:
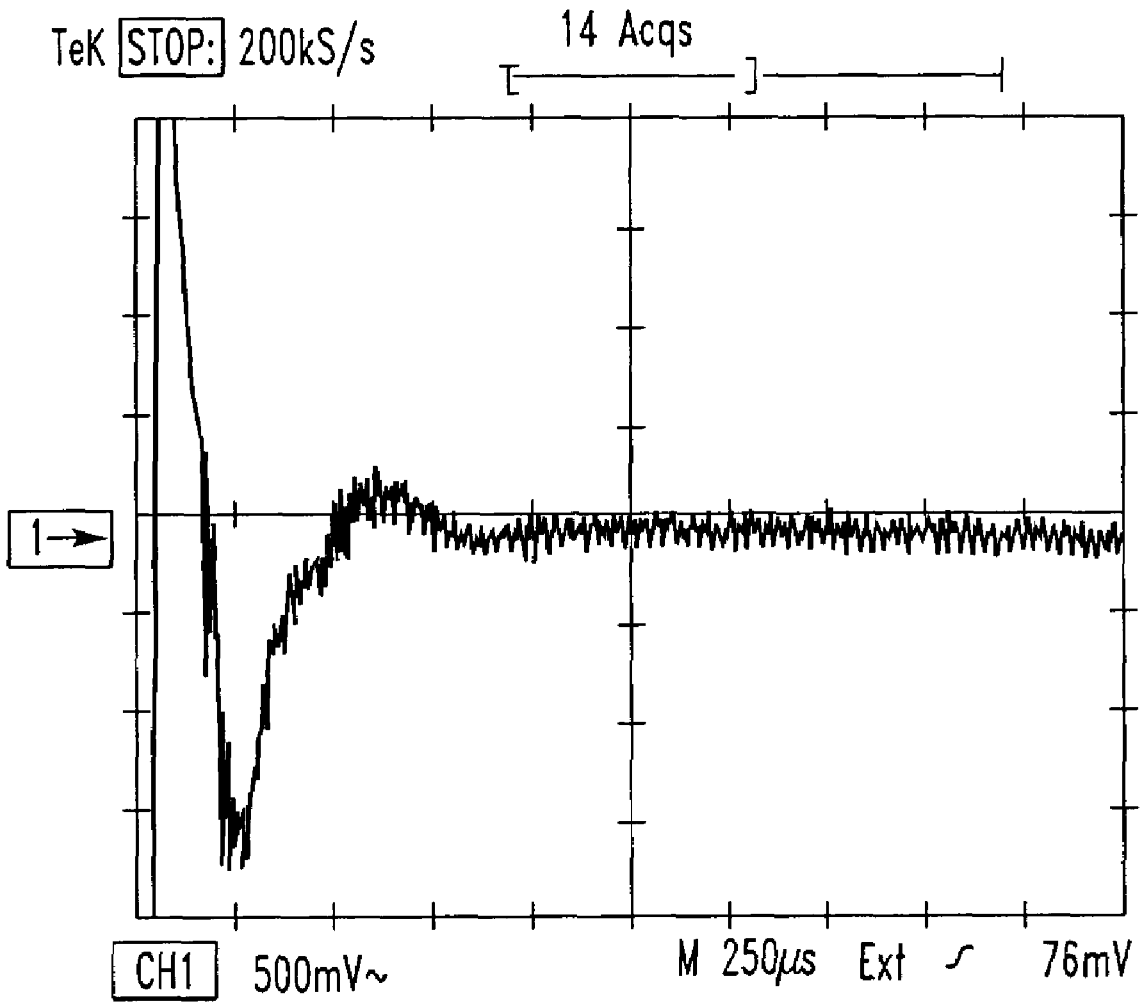
FIG. 14 is an oscilloscope display showing the crosstalk between two gas matrix transducers according to this invention in physical contact with each other.
Figure 15:
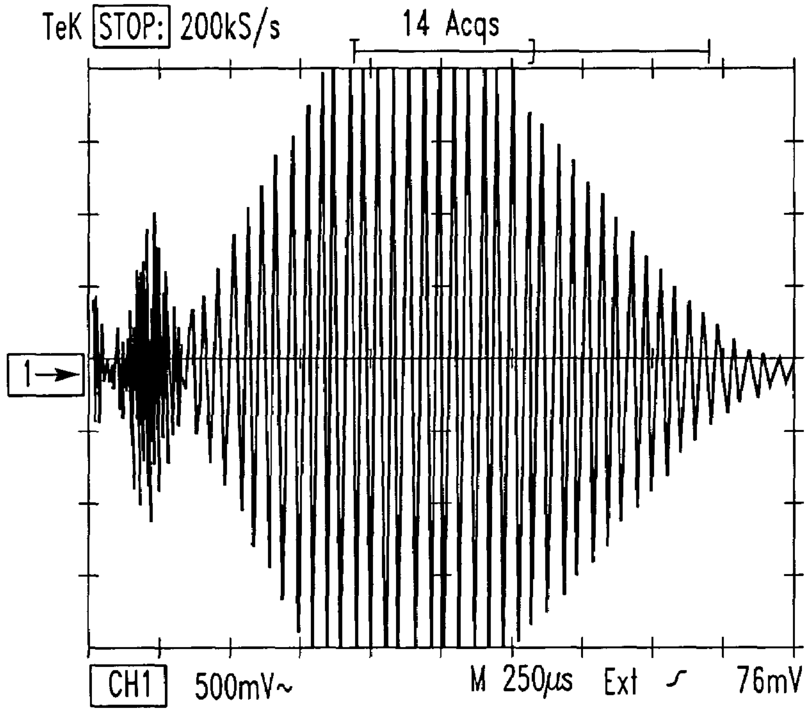
FIG. 15 is an oscilloscope display showing the crosstalk between two comparative polymer matrix transducers in physical contact with each other.
Figure 16:
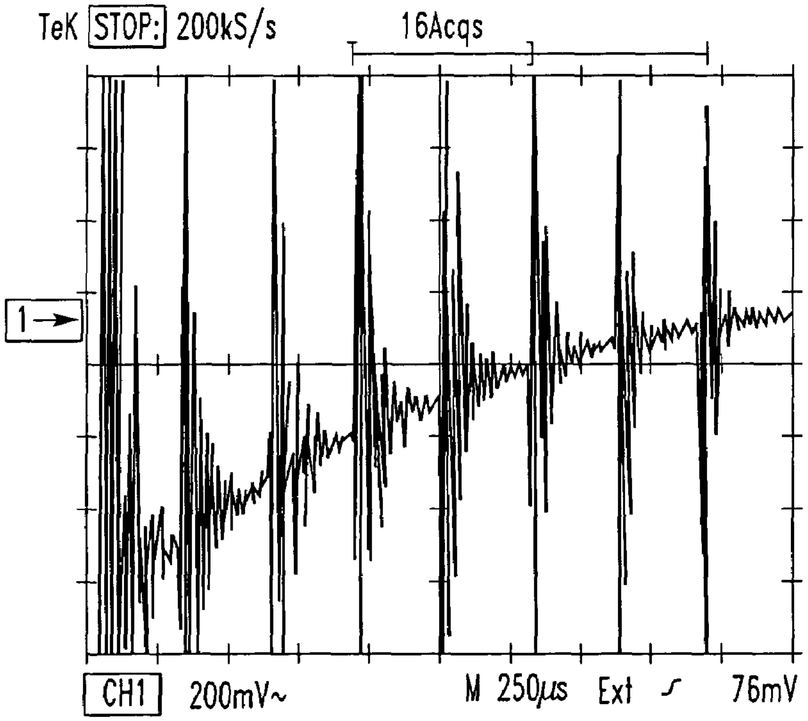
FIG. 16 is an oscilloscope display showing fully resolved multiple reflected signals through air from a surface to a gas matrix transducer according to this invention.
Figure 17:
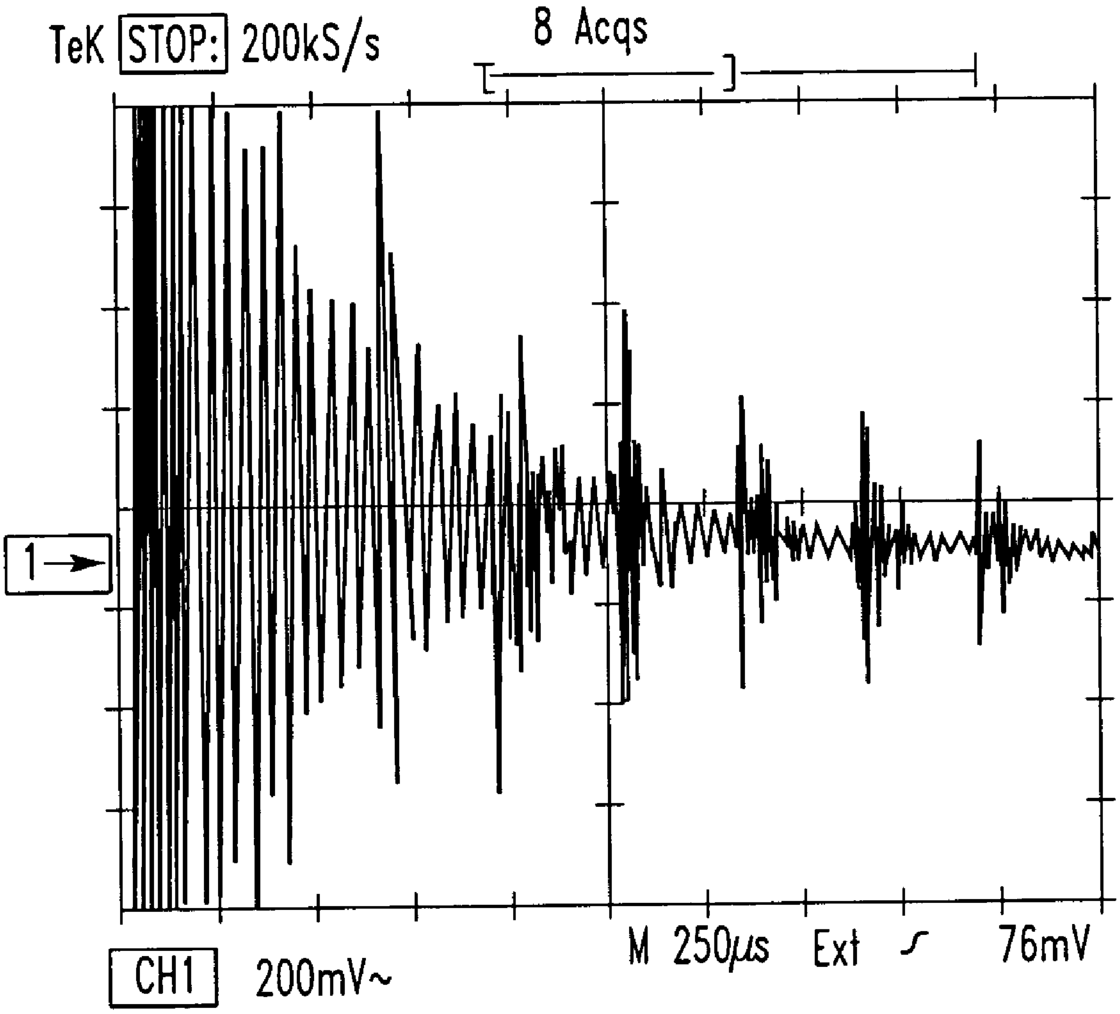
FIG. 17 is an oscilloscope display showing poorly resolved multiple reflected signals through air to a comparative polymer matrix transducer.

If an application demands more than one transducer to be placed side-by-side, such as in the case of linear, phased, or matrix arrays, then the gas matrix based piezoelectric transducers offer a significant advantage. This advantage pertains to the fact that gas matrix piezoelectric material is virtually free from the deleterious effects of planar coupling. Therefore, multiple transducers based upon this invention can be closely placed against each other without practically any crosstalk between them. FIGS. 14 and 15 illustrate the crosstalk between two abutting gas matrix transducers and two adjacent polymer matrix transducers, respectively. FIGS. 16 and 17 illustrate relative signal-to-noise ratio of multiple reflections from a flat target at 60 mm. The reflected signal for the gas matrix transducer is fully resolved upon receipt of the first reflection. The noise prevents full resolution until a much later time.

The extremely low crosstalk between adjacent transducers according to this invention makes possible linear and two-dimensional arrays of the transducers.

Figure 18:
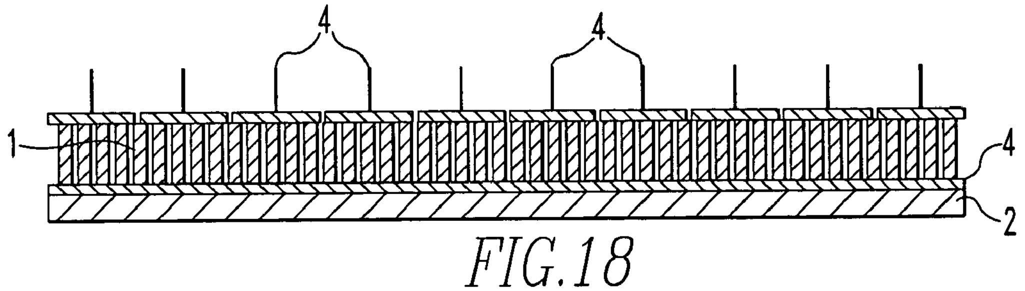
FIG. 18 is a schematic cross section of an array of transducers according to one embodiment of this invention.
Figure 19:
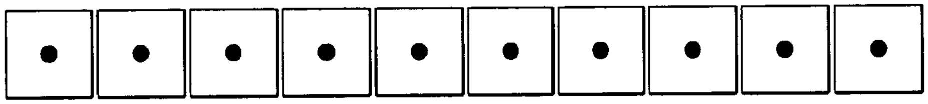
FIG. 19 is a schematic plan view of a linear array of transducers according to this invention.
Figure 20:
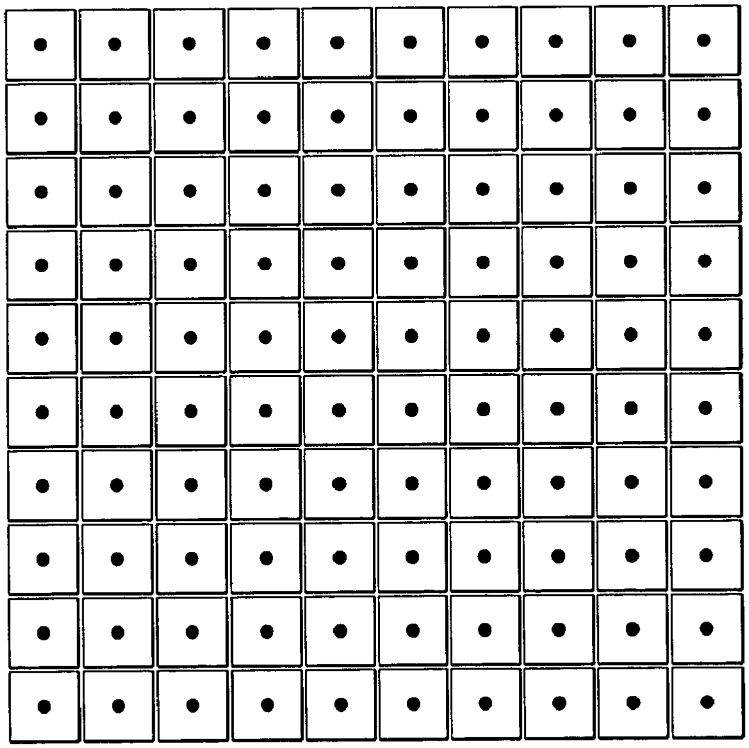
FIG. 20 is a schematic plan view of a two-dimensional array according to this invention.

FIGS. 18 and 19 show the schematics of a linear array. FIG. 20 shows the schematics of a matrix array. Individual transducers in the array design can be of any desired shape. With two-dimensional arrays, instant sonic pictures are possible.

Gas matrix piezoelectrics are lighter by more than 50% relative to polymer based piezoelectric composites and moer than ligther relative to solid piezoelectric matrialis, have higer resolutoin, have zero crosstalk, and can have complex shapes. Pyroelectric effects are much lower, therefore, much lower surface temperatres of tranducers, therefore, easier to handle, have longer life, and are more robust.

Having thus described my invention with the detial and particularity required by the Patent Laws, what is desired protected by Letters Patent is set forth in yhe following claims.

The invention claimed is:

1. A piezoelectric transducer defined by two faces comprising:

a honeycomb support structure that provides mechanical strength to the transducer between said faces;

a plurality of piezoelectric cylinders arranged within said support structure and between the parallel faces with cylindrical axes substantially perpendicular to said parallel faces, the axial length and composition of the piezoelectric cylinders determining the frequency of the transducers when excited, said piezoelectric cylinders separated from each other by a space including the honeycomb support structure and there being a gap end to end in said space between the piezoelectric cylinders, said piezoelectric cylinders separated from each other by a distance that is less than the acoustic wavelength at the frequency of said piezoelectric cylinders in the space therebetween; and electrodes abutting the parallel faces of the transducer for simultaneously exciting said cylinders.

2. A piezoelectric transducer array defined by two substantially parallel faces comprising:

a honeycomb support structure that provides mechanical strength to the transducer between said faces;

a plurality of piezoelectric cylinders arranged within said support structure between the parallel faces with cylindrical axes substantially perpendicular to said parallel faces, the axial length and composition of the piezoelectric cylinders determining the frequency of the transducers when excited, said piezoelectric cylinders separated from each other by a space including the honeycomb support structure and there being a gap end to end in said space between the piezoelectric cylinders; and electrodes at abutting the faces of the transducer for exciting the piezoelectric cylinders, the electrodes at at least one face being divided into a plurality of segments such that each segment may excite an adjacent group of piezoelectric cylinders.

3. The piezoelectric transducer according to any one of claims 1 and 2, wherein said piezoelectric cylinders are separated from each other by a distance that is less than the acoustic wavelength at the frequency of said piezoelectric cylinders in the space therebetween.

4. The piezoelectric transducer according to any one of claims 1 and 2, wherein the piezoelectric cylinders have one or more of the following cross sections: circular, rectangular, hexagonal, or any other polygon, with a width less than one wavelength of the frequency in the piezoelectric material.

5. The piezoelectric transducer according to any one of claims 1 and 2, wherein the width of the cross sections of the piezoelectric cylinders is less than one wavelength of the frequency of the cylinders.

6. The piezoelectric transducer of claims 1 or 2, wherein the honeycomb support scheme is a non-electrically conductive fibrous material.

7. The piezoelectric transducer of any one of claims 1 and 2, wherein empty space between the piezoelectric cylinders is filled with a gas at atmospheric pressure.

8. The piezoelectric transducer of any one of claims 1 and 2, wherein empty space between the piezoelectric cylinders is filled with a gas below atmospheric pressure.

9. The piezoelectric transducer of any one of claims 1 and 2, wherein empty space between the piezoelectric cylinders is at a vacuum.

10. The piezoelectric transducer of any one of claims 1 and 2, wherein electrodes comprise a foil layer.

11. The piezoelectric transducer of any one of claims 1 and 2, wherein electrodes comprise a thin conductive coating.

* * * * *

UNITED STATES PATENT AND TRADEMARK OFFICE

CERTIFICATE OF CORRECTION

PATENT NO. : 7,382,082 B2
APPLICATION NO. : 10/337531
DATED : June 3, 2008
INVENTOR(S) : Bhardwaj It is certified that error appears in the above-identified patent and that said Letters Patent is hereby corrected as shown below:

Column 10, Line 27, Claim 2, "electrodes at abutting" should read -- electrodes abutting --

Signed and Sealed this

Twenty-first Day of October, 2008

JON W. DUDAS
*Director of the United States Patent and Trademark Office*